(12) United States Patent
McHugh et al.

(10) Patent No.: US 6,264,489 B1
(45) Date of Patent: *Jul. 24, 2001

(54) ZIF SOCKET WITH LOCKING MEANS

(75) Inventors: Robert G McHugh, Evergreen, OR (US); Wen-Chun Pei, Taipei; Yu-Sung Lee, Yung-Ho, both of (TW)

(73) Assignee: Hon Hai Precision Ind. Co., Ltd., Taiepi Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/410,571

(22) Filed: Oct. 1, 1999

(51) Int. Cl.[7] .................................................. H01R 4/50
(52) U.S. Cl. ............................................................ 439/342
(58) Field of Search ..................... 439/259, 263, 439/266, 342

(56) References Cited

U.S. PATENT DOCUMENTS 5,730,615 * 3/1998 Lai et al. ............................. 439/342
6,059,596 * 5/2000 Pei et al. ............................. 439/342

* cited by examiner

Primary Examiner—Khiem Nguyen
(74) Attorney, Agent, or Firm—Wei Te Chung (57) ABSTRACT

A zero insertion force socket comprises a base and a cover movably mounted on the base. The base has a body portion from a front edge of which a head extends and two cutouts defined beside the head. A hole is defined in the head and in communicating with the two cutouts via a space defined below the bottom of the head. The cover has two sockets extending downward therefrom and movably received in the cutouts. A locking strip has two ends firmly retained in the sockets and an intermediate portion positioned in the space below the bottom of the head. A spring member is formed in the intermediate portion of the locking strip and movably received in the hole of the head of the base. A recess is defined at a bottom of the base for receiving the spring member when the spring member is deformed and moved together with the cover.

18 Claims, 8 Drawing Sheets

ZIF SOCKET WITH LOCKING MEANS

BACKGROUND OF THE INVENTION

1. Field of The Invention

The present invention relates to a zero insertion force (ZIF) socket, and especially to a ZIF socket having locking means for retaining the socket in either a closed status or an open status.

2. The Prior Art

Conventional zero insertion force (ZIF) sockets normally comprise a cover defining a plurality of upper passageways therein and slidably engaging with a base having a corresponding number of lower passageways retaining contacts therein. The upper passageways and the lower passageways are in constant communication with each other when the cover is moved with respect to the base. A cam is received in a space defined between the cover and the base and operative to move the cover with respect to the base thereby positioning the socket at either an open status ready for insertion of pins of a CPU package or a closed status forcing the pins of the CPU package to abut against the corresponding contacts. When the socket is in the open status, the pins of the CPU package are inserted into the upper passageways and the lower passageways with a substantially zero insertion force, but are not in electrical contact with the contacts retained in the lower passageways. The cam is then operated to drive the cover to move laterally relating to the base thereby urging the pins of the CPU package to electrically connect with the contacts of the base. U.S. Pat. No. 5,730,615 which belongs to the same assignee of this application has disclosed a socket having a cover movably engaged with a base and positioning means including a vertical protrusion on the side face of the base to cooperate with a pair of spaced shallow regions, named front shallow region and rear shallow region, formed in the interior portion of the cover. Therefore, the protrusion of the base may be received within the front shallow region in the cover when the socket is in an open status, and within the rear shallow region when the socket is in a closed status. However, the positioning of the vertical protrusion in either the front shallow region or the rear shallow region is not strong enough to guarantee unwanted movement of the vertical protrusion. It is requisite to provide locking means to fix the cover to the base in either a closed status or an open status.

SUMMARY OF THE INVENTION

The primary purpose of the present invention is to provide an improved ZIF socket having locking means for fixing the cover in either one of a closed status and an open status.

In accordance with one aspect of the present invention, a zero insertion force socket comprises a base and a cover movably mounted on the base. The base has a body portion from a front edge of which a head extends and two cutouts defined beside the head. A hole is defined in the head and in communicating with the two cutouts via a space defined below the bottom of the head. The cover has two sockets extending downward therefrom and movably received in the cutouts. A locking strip has two ends firmly retained in the sockets and an intermediate portion positioned in the space below the bottom of the head. A spring member is formed in the intermediate portion of the locking strip and movably received in the hole of the head of the base. A recess is defined at a bottom of the base for receiving the spring member when the spring member is deformed and moved together with the cover.

DETAILED DESCRIPTION OF THE PREFERRED EMBODIMENT

Figure 1:
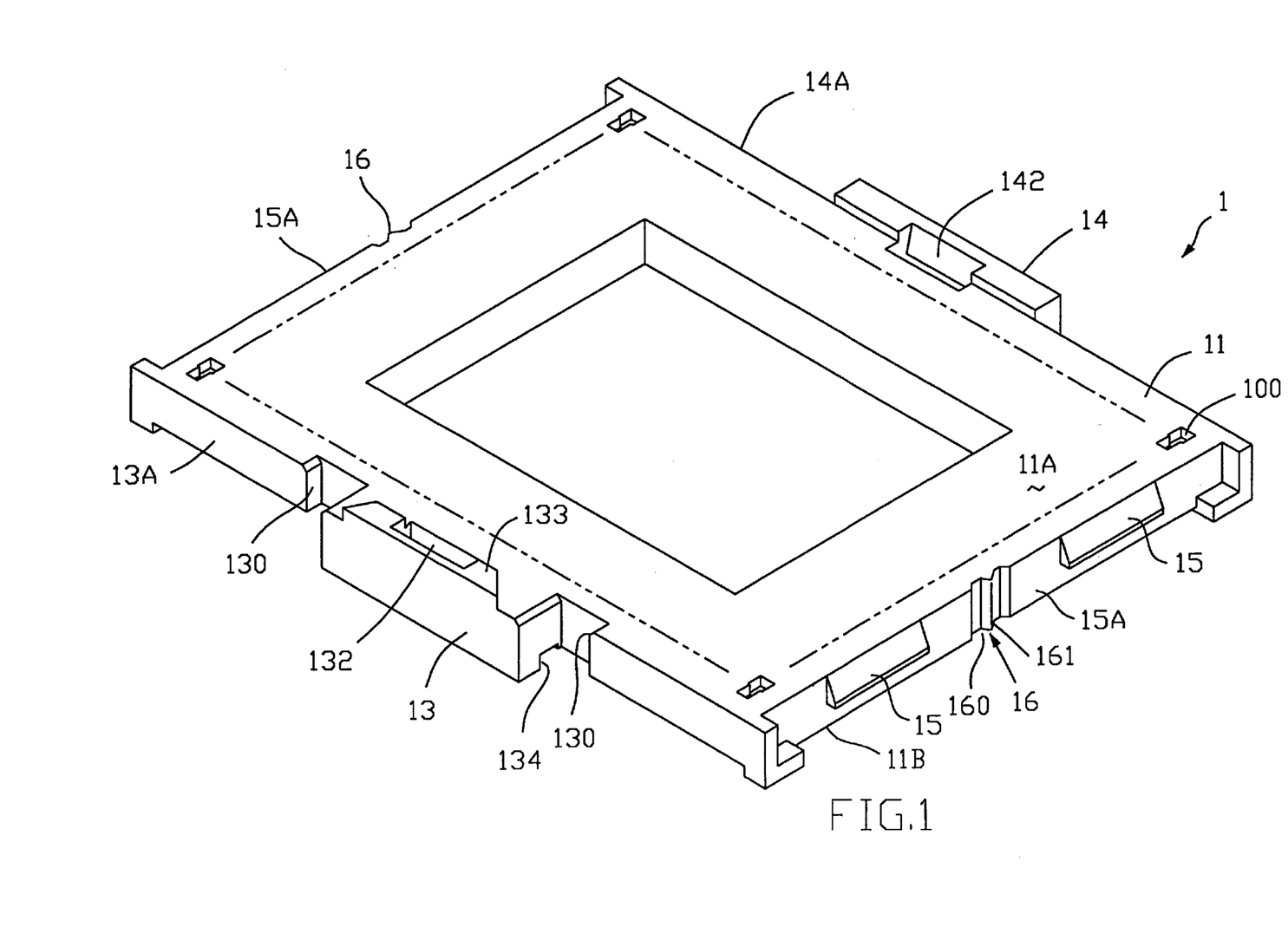
FIG. 1 is a perspective view of a base of a ZIF socket connector in accordance with the present invention.

Referring to FIG. 1, a base 1 of a socket in accordance with the present invention comprises a housing 11 having an upper surface 11A and a bottom surface 11B, a first head 13 and a second head 14 respectively extending from a front side 13A and a rear side 14A of the housing 11. The housing 11 has two sliders 15 formed in opposite parallel sides 15A thereof and defines a plurality of passageways 100 receiving contacts (not shown) therein for electrically and mechanically connecting to CPU pins (not shown) inserted thereinto. Two cutouts 130 are formed in the front side 13A of the housing 11 beside the first head 13. The first head 13 defines a hole 132 which has a portion extending into the front side 13A of the housing 11. The second head 14 defines a hole 142 which has a portion extending into the rear side 14A of the housing 11. A channel 134 formed at the bottom of the base 1 for communicating between the cutouts 130 and the hole 132. A U-shaped protrusion 133 projects upward from the first head 13 and surrounds around a half portion of the hole 132. A pair of positioning members 16 are formed in the parallel sides 15A of the housing 11 and each positioning member 16 is located between the sliders 15. Each position member 16 comprises a groove 160 and a triangular rib 161 extending from a middle portion of the groove 160.

Figure 2A:
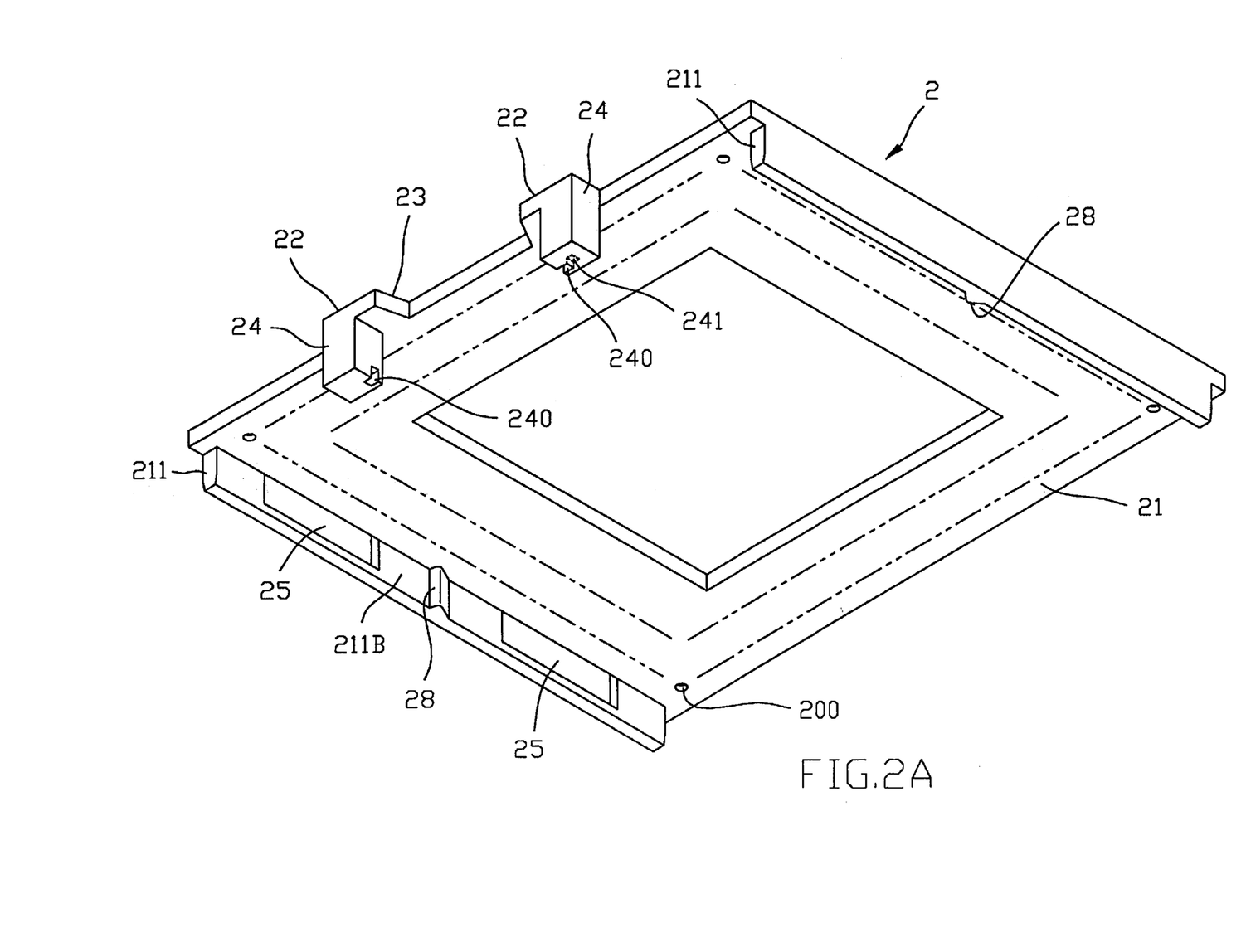
FIGS. 2A, 2B and 2C are perspective views of different types of covers in accordance with the present invention.

Referring to FIG. 2A, a cover 2 adapted to be slidably engaged with the base 1 comprises a body portion 21 and two heads 22 extending from the body portion 21 thereby defining a reception space 23 between the heads 22 for movably receiving the U-shaped protrusion 133 of the base 1 when the cover 2 is assembled to the base 1. Two sockets 24 respectively extend downward from the heads 22 and they are movably received in the cutouts 130 of the base 1 when the cover 2 is assembled to the base 1. Each socket 24 has a cavity 240 formed therein and an internal step 241 is formed in each cavity 240. The body portion 21 has a plurality of conic holes 200 formed therein for receiving CPU pins (not shown) and each conic hole 200 is maintained in constant communication with a corresponding passageway 100 of the base 1 when the cover 2 is assembled to and moved on the base 1. Two guiding arms 211 extend downward from parallel opposite sides of the body portion 21 and each guiding arm 211 has two guiding recesses 25 formed in an inner wall 211B thereof for slidably receiving the sliders 15 of the base 1 when the cover 2 is assembled to the base 1. The inner surfaces 211B of the guiding arms 211 are parallel to each other so the cover 2 may move smoothly on the base 1 when they are assembled to each other. A pair of triangular ribs 28 having substantially identical shape to the triangular rib 161 of the base 1 is formed in the inner walls 211B of the guiding arms 211.

Figures 3A, 3B, 3C:
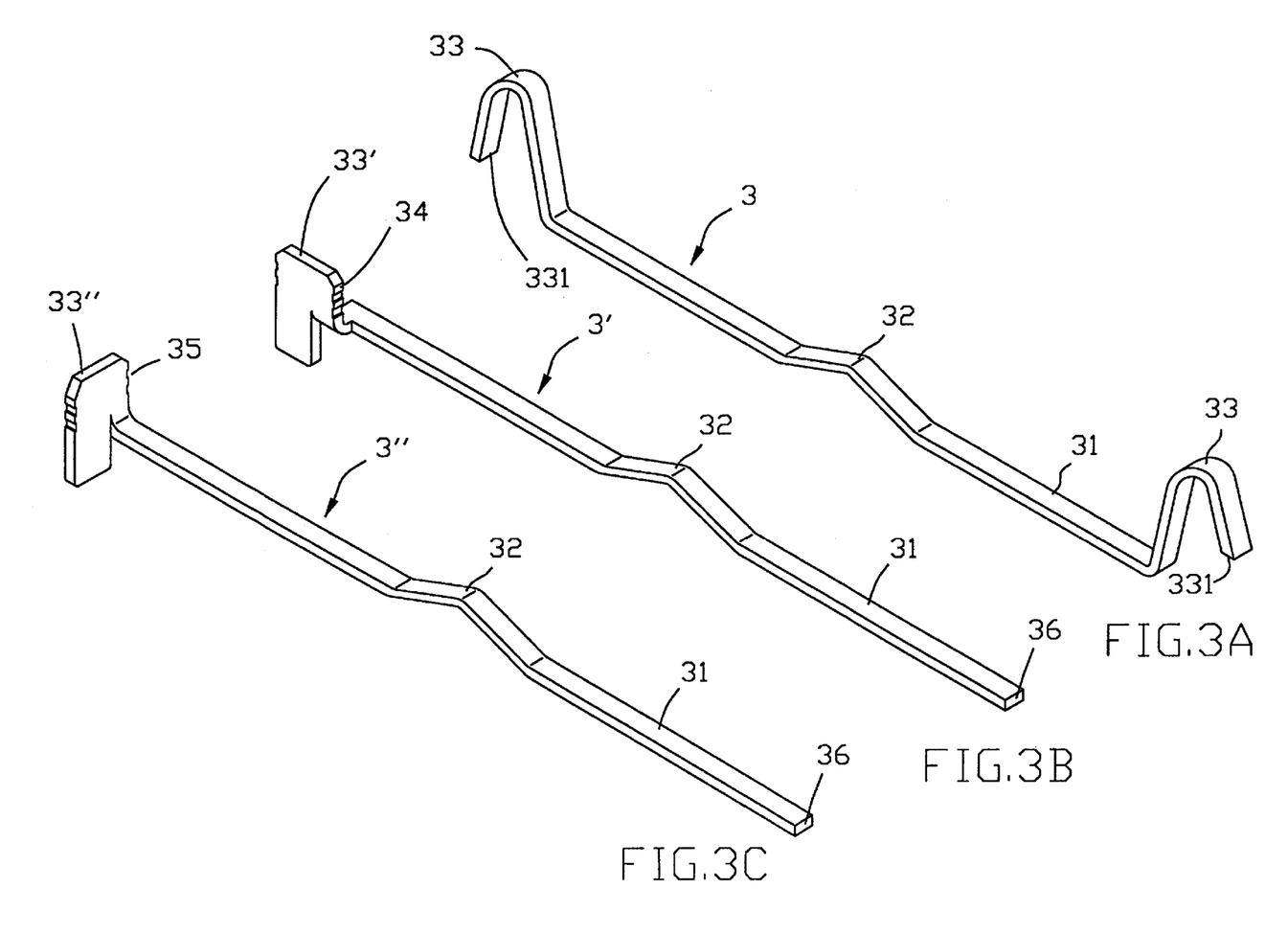
FIGS. 3A, 3B and 3C are perspective views of different types of locking means used in the present invention.

Referring to FIG. 3A, a locking means 3 is made of metal strip via stamping and bending. The locking means 3 comprises an elongated strip 31, a V-shaped spring member 32 formed in a middle of the elongated strip 31 functioning like a spring upon depression, and two U-shaped portions 33 formed at two ends of the elongated strip 31, wherein each U-shaped portion 33 has a free end 331 positioned above an extension line of the elongated strip 31.

Figure 4A:
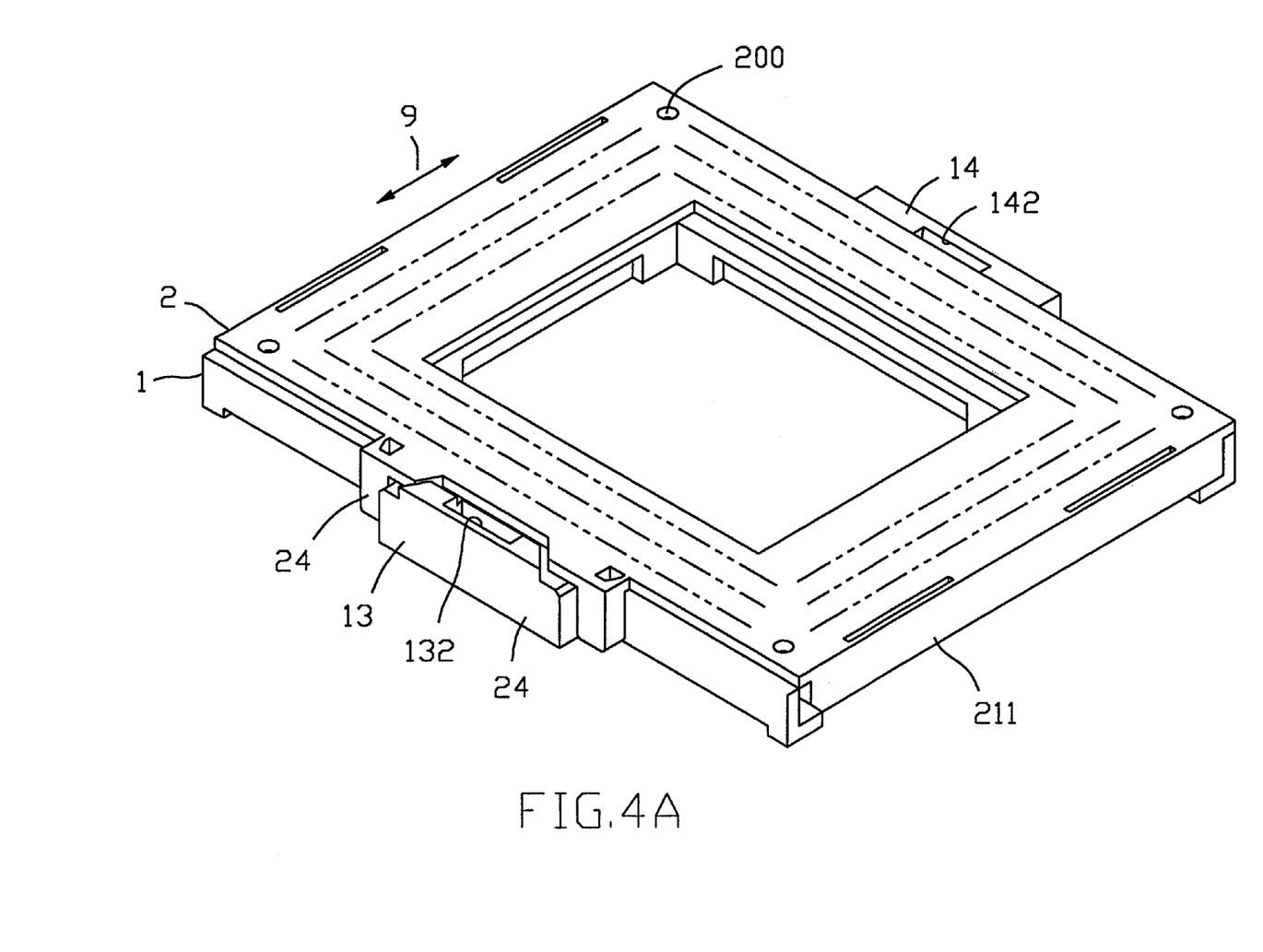
FIG. 4A is an assembled view of FIGS. 1, 2 and 3A.
Figure 4B:
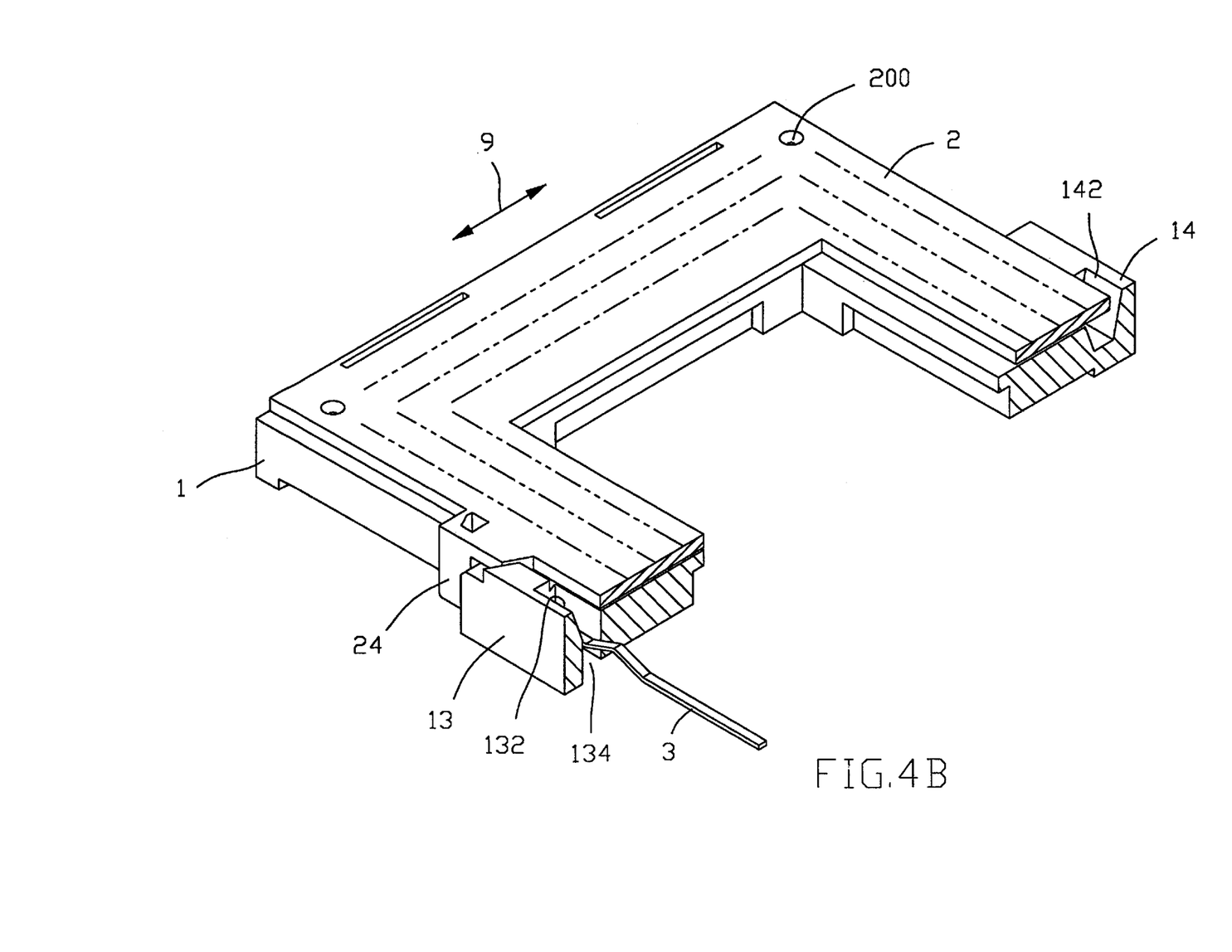
FIG. 4B is a partially broken view taken from FIG. 4A.

Also referring to FIGS. 4A and 4B, in assembling, the cover 2 is engaged with the base 1, with the guiding arms 211 thereof movably clamping two sides 15A of the base 1, the guiding recess 25 movably receiving the slider 15, the triangular rib 28 received in the groove 160, the reception space 23 movably receiving the U-shaped protrusion 133, the sockets 24 movably received in the cutouts 130. The elongated strip 31 and the V-shaped spring member 32 of the locking means 3 is then inserted into the hole 132 of the first head 13 with most portion of the elongated strip 31 retained in the channel 134 of the first head 13, and the U-shaped portions 33 thereof are forcedly inserted into the cavities 240 of the sockets 24 of the cover 2 and the free end 331 thereof abuts against the internal step 241 of the cavity 240. After assembly, the cover 2 may be moved in opposite directions as shown in numeral 9.

Figure 5A:
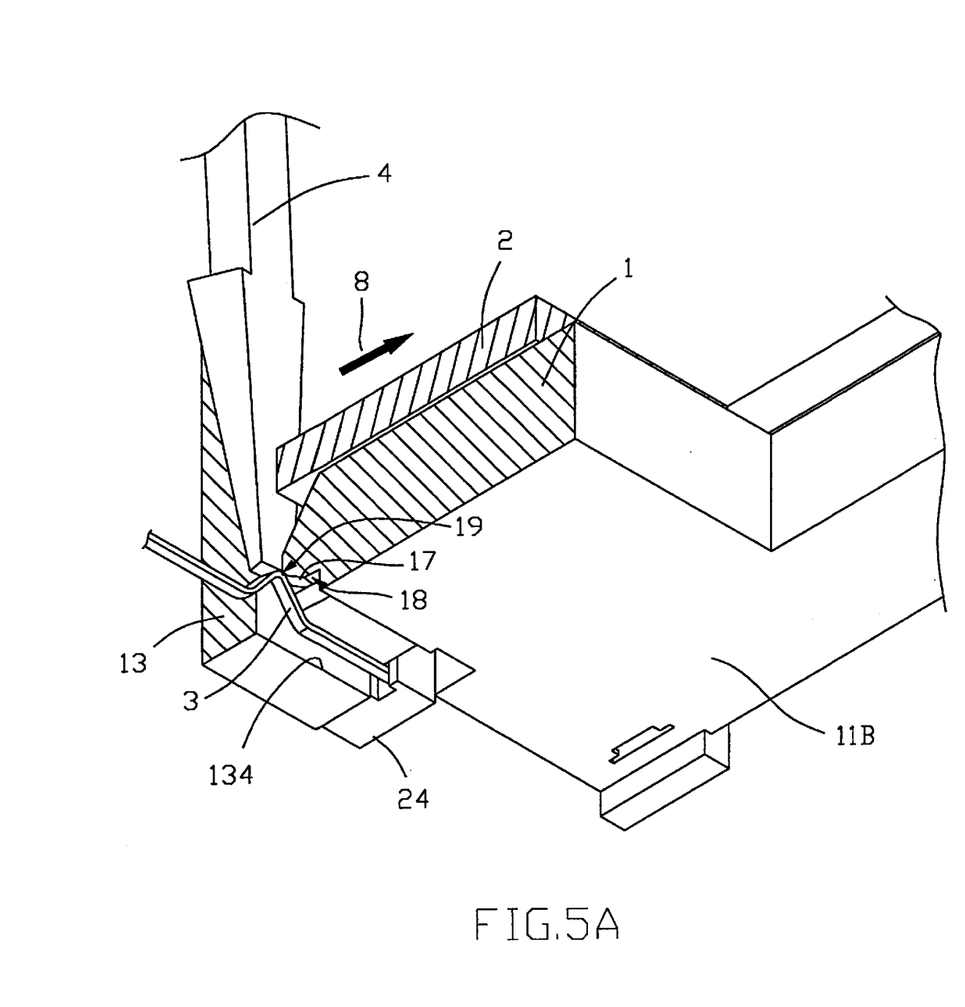
FIG. 5A is an operational view showing perspective view of a screw driver operating on the locking means.
Figure 5B:
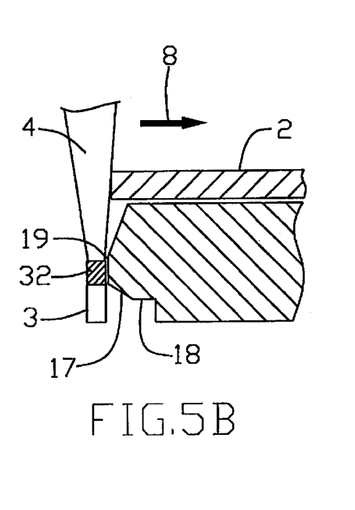
FIG. 5B is an schematic view showing the operation of FIG. 5A.

Referring to FIGS. 5A and 5B, normally the socket is in a closed status in which the V-shaped spring member 32 of the locking means 3 is retained in the hole 132 (also see FIG. 4B) contacting with a lower portion 19 of the base 1 and prevents the cover 2 from moving into an open status. When a screw driver 4 is used to drive the cover 2 to move along a direction 8 from a closed status to an open status, a downward force applied by the screw driver 4 will depress the V-shaped spring member 32 thus the V-shaped spring member 32 will deform and be moved together with the cover 2, sliding over a ramp surface 17 defined at a bottom portion of the base 1 and finally positioned in a bottom recess 18 defined at the end of the ramp surface 17. When the V-shaped spring member 32 is deformably retained in the bottom recess 18 of the base 1, a preload of the V-shaped spring member 32 can retain the socket in the open status for zero insertion of an IC package (not shown). After the IC package is inserted into the ZIF socket, the screw driver 4 may be operated in the hole 142 defined in the second head 14 to drive the cover 2 to move in an opposite direction to the direction 8 thereby moving the deformed V-shaped spring member 32 out of the bottom recess 18 and recovering the ZIF socket to the original closed status.

Figure 2B:
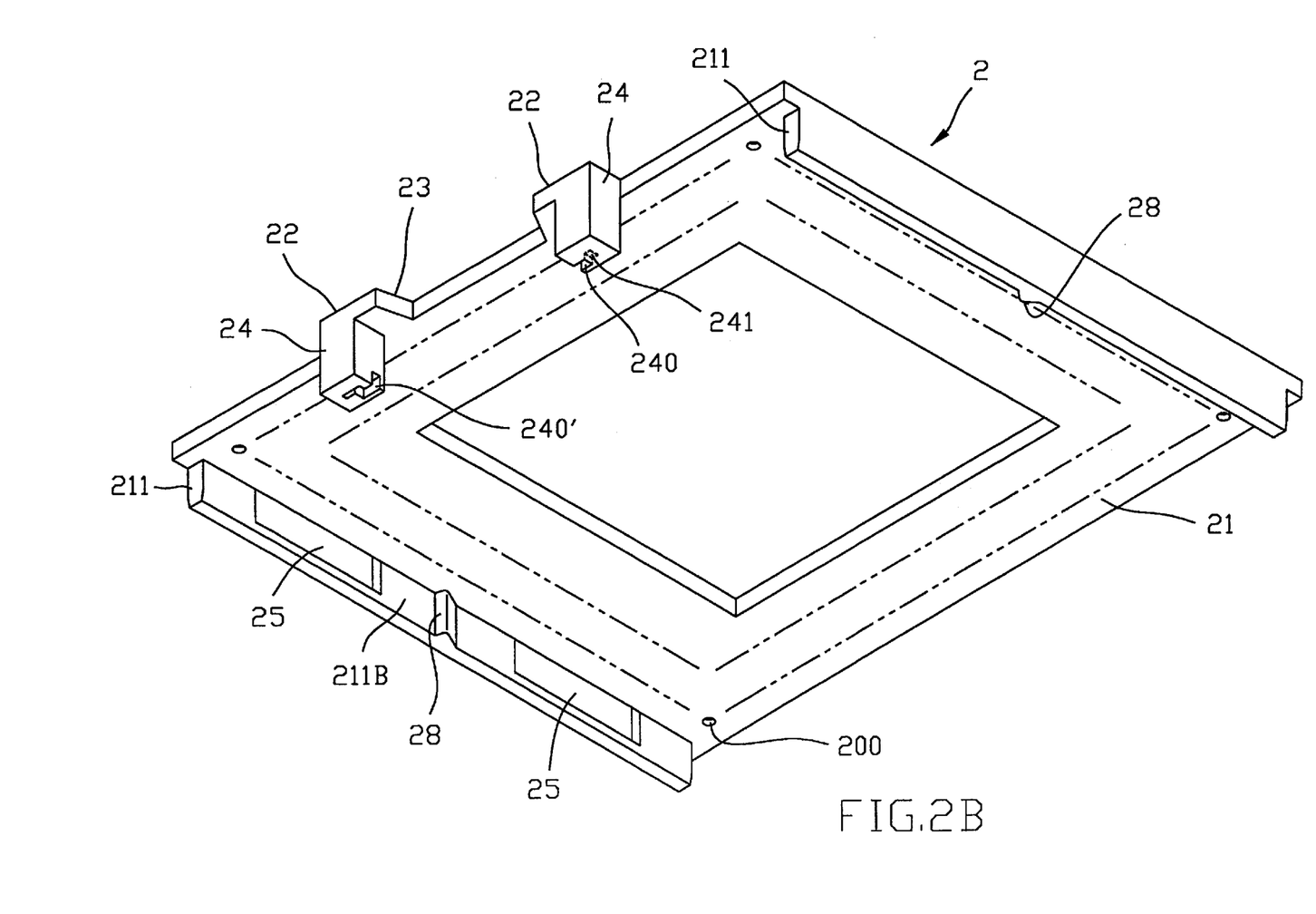

The present invention may have a second embodiment which is almost the same with the previous embodiment except the locking means 3. Referring to FIG. 3B, a locking means 3' in the second embodiment comprises an elongated strip 31, a V-shaped portion 32 formed in a middle of the elongated strip 31, an engagement plate 33' bent and formed at one end of the elongated strip 31 and having barbs 34 formed in two sides thereof, and a straight free end 36. In the second embodiment, the cover 2 is amended only at one of the cavities 240. Referring to FIG. 2B, the amended cavity is designated 240' which does not include the internal step therein and which is adapted to receive the engagement plate 33', with the barbs 34 of the engagement plate 33' being firmly fixed in the amended cavity 240'. A straight free end 36 of the locking means 3' is rested on the internal step 241 of the cavity 240.

Figure 2C:
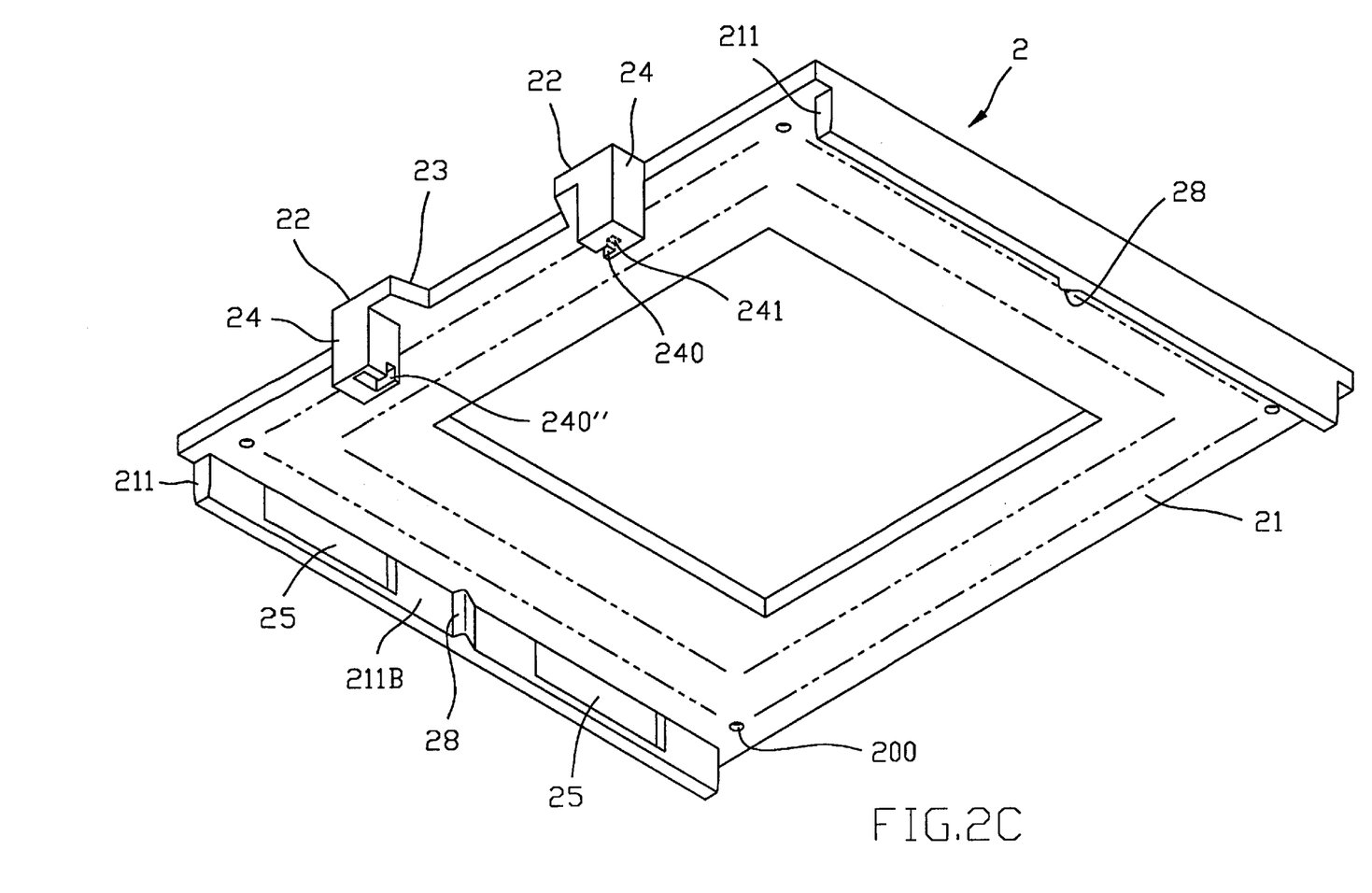

Similarly, a third embodiment may be obtained by changing the locking means 3' and the cavity 240' from the second embodiment. Referring to FIG. 3C, a new locking means 3" is provided to have the similar structure to the locking means 3' of the second embodiment with an exception that the engagement plate 33" is bent in different orientation. The new engagement 33" has barbs 35 formed in two sides thereof. Also referring to FIG. 2C, a new cavity 240" is provided in one of the sockets 24 for firmly retaining the engagement plate 33" therein. A straight free end 36 of the locking means 3" is rested on the internal step 241 of the cavity 240.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A zero insertion force socket comprising a base and a cover movably mounted on the base, the base having a body portion from a front edge of which a head extends and two cutouts defined beside the head;

a hole defined in the head and communicating with the two cutouts via a space defined below the bottom of the head;

the cover having two sockets extending downward therefrom and movably received in the cutouts;

a locking strip having two ends firmly retained in the sockets and an intermediate portion positioned in the space below the bottom of the head;

a spring member formed in the intermediate portion of the locking strip and movably received in the hole of the head of the base;

a recess defined at a bottom of the base for receiving the spring member when the spring member is deformed and moved together with the cover.

2. The zero insertion force socket as claimed in claim 1, wherein the base defines a ramp at a bottom surface thereof for guiding the deformed spring member to the recess when the spring member is deformed and moved by the cover.

3. The zero insertion force socket as claimed in claim 1, wherein each end of the locking strip is a U-shaped structure.

4. The zero insertion force socket as claimed in claim 3, wherein each socket has an internal step formed therein for rest of a free end of the U-shaped structure.

5. The zero insertion force socket as claimed in claim 1, wherein at least one end of the locking strip is a straight portion.

6. The zero insertion force socket as claimed in claim 5, wherein the at least one end of the locking strip is rested on an internal step formed in the socket.

7. The zero insertion force socket as claimed in claim 1, wherein at least one end of the locking strip is an engagement plate bent and formed from the locking strip and having barbs formed in two sides thereof for engagement within the socket.

8. The zero insertion force socket as claimed in claim 1, wherein the spring member is a V-shaped structure.

9. A zero insertion force socket comprising a base and a cover movably mounted on the base, the base having a hole defined through an upper surface and a bottom surface thereof, the cover having two sockets extending from a same side thereof, an elongated strip having a spring member extending into the hole of the base from the bottom surface thereof and two engagement portions formed at two ends thereof and retained in the sockets of the cover;

whereby the spring member of the elongated strip is operative to move out of the hole of the base by the cover and retained at a bottom portion of the base when the cover is moved with respect to the base.

10. The zero insertion force socket as claimed in claim 9, wherein the base defines a ramp at a bottom surface thereof for guiding the spring member to the bottom portion of the base when the spring member is operative to move with the cover.

11. The zero insertion force socket as claimed in claim 9, wherein each engagement portion of the locking strip is a U-shaped structure.

12. The zero insertion force socket as claimed in claim 11, wherein each socket has an internal step formed therein for rest of a free end of the U-shaped structure.

13. The zero insertion force socket as claimed in claim 9, wherein at least one engagement portion of the locking strip is a straight portion.

14. The zero insertion force socket as claimed in claim 13, wherein the at least one engagement portion of the locking strip is rested on an internal step formed in the socket.

15. The zero insertion force socket as claimed in claim 9, wherein at least one engagement portion of the locking strip is a plate bent and formed from the locking strip and having barbs formed in two sides thereof for engagement within the socket.

16. The zero insertion force socket as claimed in claim 9, wherein the spring member is a V-shaped structure.

17. A zero insertion force socket comprising:

a socket and a cover movably mounted unto the base;

said base including a head portion with a hole therein; and a locking strip defining a first section retained to the cover and a second section extending into the hole and restrained by the base, the second section being downwardly deflectable to escape from restraint of the base; wherein when the socket is in a closed status, the second section of the strip is upwardly received within the hole so as not to allow the cover to move with regard to the base; when the socket is changed from the closed status to an open status, the second section is downwardly urged by a tool, which actuates the cover, to be deflected and released from the base so as to allow the cover to move along therewith in respect to the base.

18. The socket as claimed in claim 17, wherein said cover includes an edge adjacent to the opening for engagement with the inserted tool.

\* \* \* \* \*